US006958672B1

(12) United States Patent
Shen et al.

(10) Patent No.: US 6,958,672 B1
(45) Date of Patent: Oct. 25, 2005

(54) SYSTEM AND METHOD FOR MAGNETIZING BLOCKS ON A MAGNET ASSEMBLY OF AN MRI DEVICE

(75) Inventors: Weijun Shen, Florence, SC (US); Bu-Xin Xu, Florence, SC (US)

(73) Assignee: General Electric Company, Schenectady, NY (US)

( * ) Notice: Subject to any disclaimer, the term of this patent is extended or adjusted under 35 U.S.C. 154(b) by 51 days.

(21) Appl. No.: 10/710,289

(22) Filed: Jun. 30, 2004

(51) Int. Cl.[7] ................................................ H01F 13/00

(52) U.S. Cl. ........................ 335/284; 335/296; 335/298

(58) Field of Search ................................ 335/284–306; 324/318–320

(56) References Cited

U.S. PATENT DOCUMENTS 4,723,116 A * 2/1988 Muller et al. ............... 335/296
6,664,878 B1 12/2003 Chen et al. ................. 335/296

* cited by examiner

*Primary Examiner*—Ramon M. Barrera
(74) *Attorney, Agent, or Firm*—Cantor Colburn LLP

(57) ABSTRACT

A system and a method for magnetizing one of a plurality of substantially non-magnetized blocks disposed on a plate of a magnetic assembly used in an MRI device are provided. The system includes first and second arm portions operably coupled together. The system further includes a first electromagnetic coil disposed on a first end of the first arm portion, wherein the first electromagnetic coil is configured to generate a magnetic field that propagates from the first electromagnetic coil through at least one non-magnetized block and the plate and further through the first and second arm portions to magnetize the block.

16 Claims, 9 Drawing Sheets

SYSTEM AND METHOD FOR MAGNETIZING BLOCKS ON A MAGNET ASSEMBLY OF AN MRI DEVICE

BACKGROUND OF THE INVENTION

A magnet assembly has been utilized to generate a uniform magnetic field for magnetic resonance imagining (MRI) systems. During manufacture of the magnet assembly, a non-magnetized plate comprising a plurality of rare-earth blocks is disposed on an iron yoke wherein the non-magnetized plate is subsequently magnetized. To simultaneously magnetize the plurality of blocks, a relatively large magnetic coil is disposed over the non-magnetized blocks that propagate a large magnetic field through the blocks.

Utilization of the relatively large magnetic coil to magnetize the non-magnetized blocks, however, has several drawbacks. First, the large magnetic coil generates relatively large amounts of heat in the blocks of the magnetic assembly and in the coils themselves that must be cooled to maintain the structural integrity of the blocks and the coils. To cool the blocks, additional cooling systems must be disposed adjacent the magnetic coil which is relatively expensive. Second, the large magnetic coils require large amounts of electrical current to generate the large magnetic field that requires relatively expensive current drivers. Third, the large magnetic coil produces relatively large electromagnetic forces on the blocks and counterforces on the coils during magnetization. To maintain the blocks and the coils at desired positions, relatively large fixtures are clamped to the yoke plates that are relatively expensive.

There is thus a need for a process of magnetizing blocks on a magnet assembly used in an MRI system that overcomes one or more of the above-mentioned deficiencies.

BRIEF DESCRIPTION OF THE INVENTION

A system for magnetizing one of a plurality of substantially non-magnetized blocks disposed on a plate of a magnet assembly used in an MRI device in accordance with an exemplary embodiment is provided. The system includes first and second arm portions operably coupled together. The system further includes a first electromagnetic coil disposed on a first end of the first arm portion, wherein the first electromagnetic coil is configured to generate a magnetic field that propagates from the first electromagnetic coil through at least one non-magnetized block and the plate and further through the first and second arm portions to magnetize the block.

A method for magnetizing at least one of a plurality of substantially non-magnetized blocks disposed on a plate of a magnet assembly used in an MRI device in accordance with another exemplary embodiment is provided. The method includes disposing first and second arm portions proximate a first non-magnetized block and the plate, respectively, wherein a first electromagnetic coil is coupled to the first arm. Finally, the method includes energizing the first electromagnetic coil to generate a first magnetic field that propagates from the first electromagnetic coil through the first non-magnetized block and the plate and further through the first and second arm portions to magnetize the first block.

DETAILED DESCRIPTION

Figure 1:
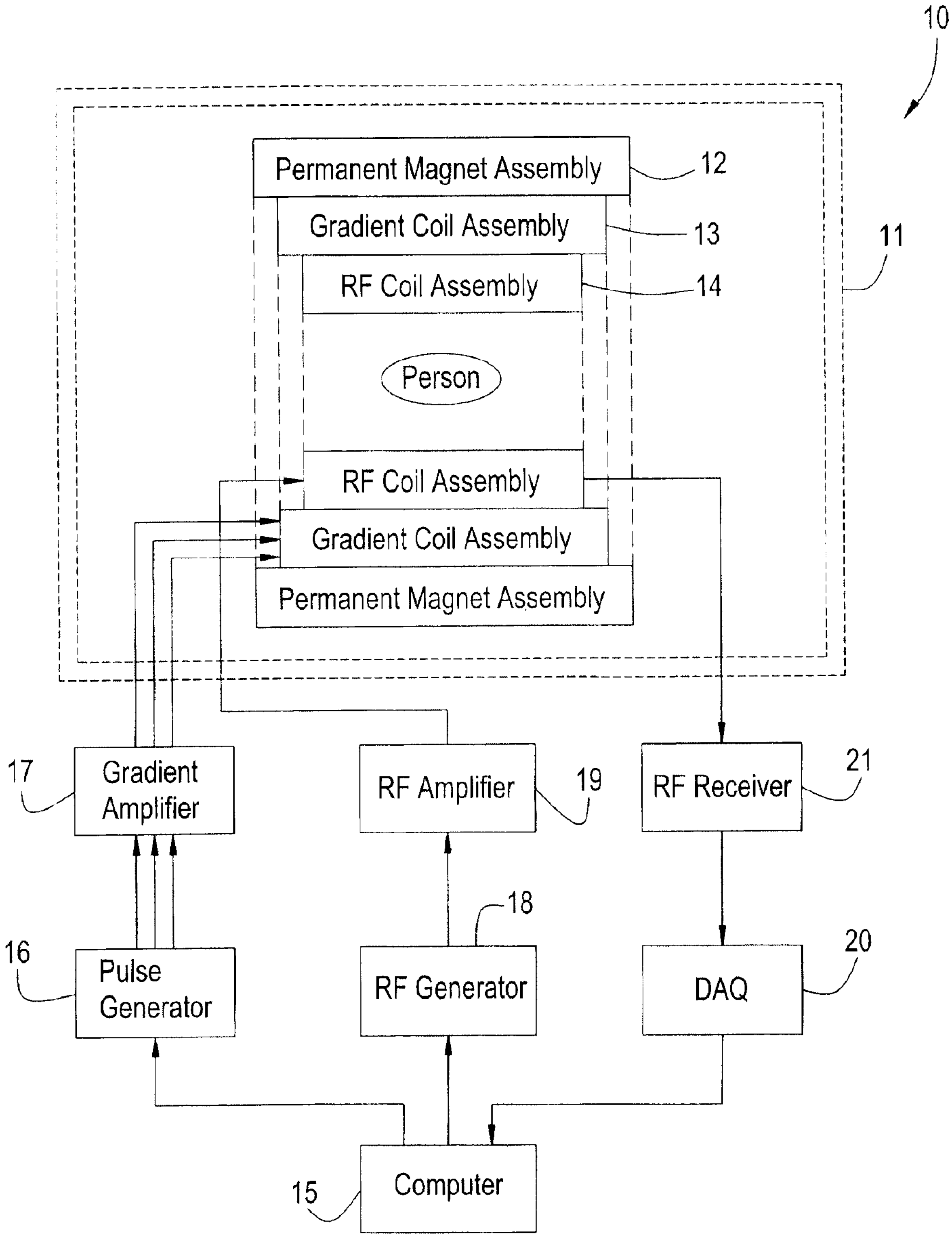
FIG. 1 is a schematic of an MRI imaging system.
Figure 2:
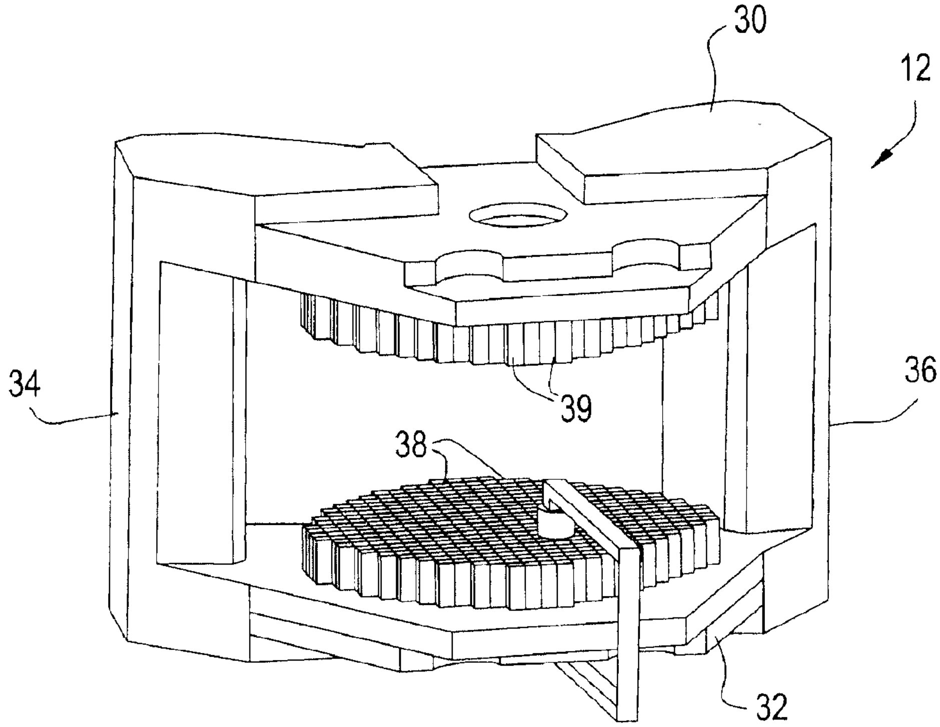
FIG. 2 is a schematic of a permanent magnet assembly utilized in the MRI imaging system of FIG. 1.

Referring to FIGS. 1 and 2, an MRI imaging system 10 for generating digital images of a person in accordance with an exemplary embodiment is shown. The MRI imaging system 10 includes a housing 11, a permanent magnet assembly 12, a gradient coil assembly 13, an RF coil assembly 14, a computer 15, a pulse generator 16, a gradient amplifier 17, an RF generator 18, an RF amplifier 19, a data acquisition board 20, and an RF receiver 21.

The RF generator 18 generates signals that are amplified by the RF amplifier 19 and transmitted to the RF coil assembly 14, in response to a control signal being received from the computer 15. In response, the RF coil assembly 14 generates RF signals that propagate to a person in a scanning region and induces nuclei in the patient to emit RF signals that are received by the RF receiver 21. The received RF signals are digitized in the data acquisition board 20 and then transmitted to the computer 15.

The pulse generator 16 generates gradient signals that are amplified by the gradient amplifier 17 and transmitted to the gradient coil assembly 13, in response to a control signal received from the computer 15. In response, the gradient coil assembly 17 produces magnetic field gradients in the scanning region used for spatially encoding acquired signals.

The permanent magnet assembly 12 is provided to generate a permanent magnetic field that also propagates through the person disposed in the scanning region. The magnetic assembly 12 includes yoke plates 30, 32, posts 34, 36, a plurality of blocks 38, a plurality of blocks 39, and pole pieces 42, 44.

The yoke plate 30 is provided to hold a plurality of blocks 39 and is constructed of iron. Similarly, the yoke plate 32 is provided to hold a plurality of blocks 38 opposite the blocks 39 and is also constructed of iron. The posts 34, 36 are both disposed between the yoke plates 30, 32 and are operably coupled to the yoke plates 30, 32, respectively at opposite ends of the yoke plates 30, 32.

Figure 4:
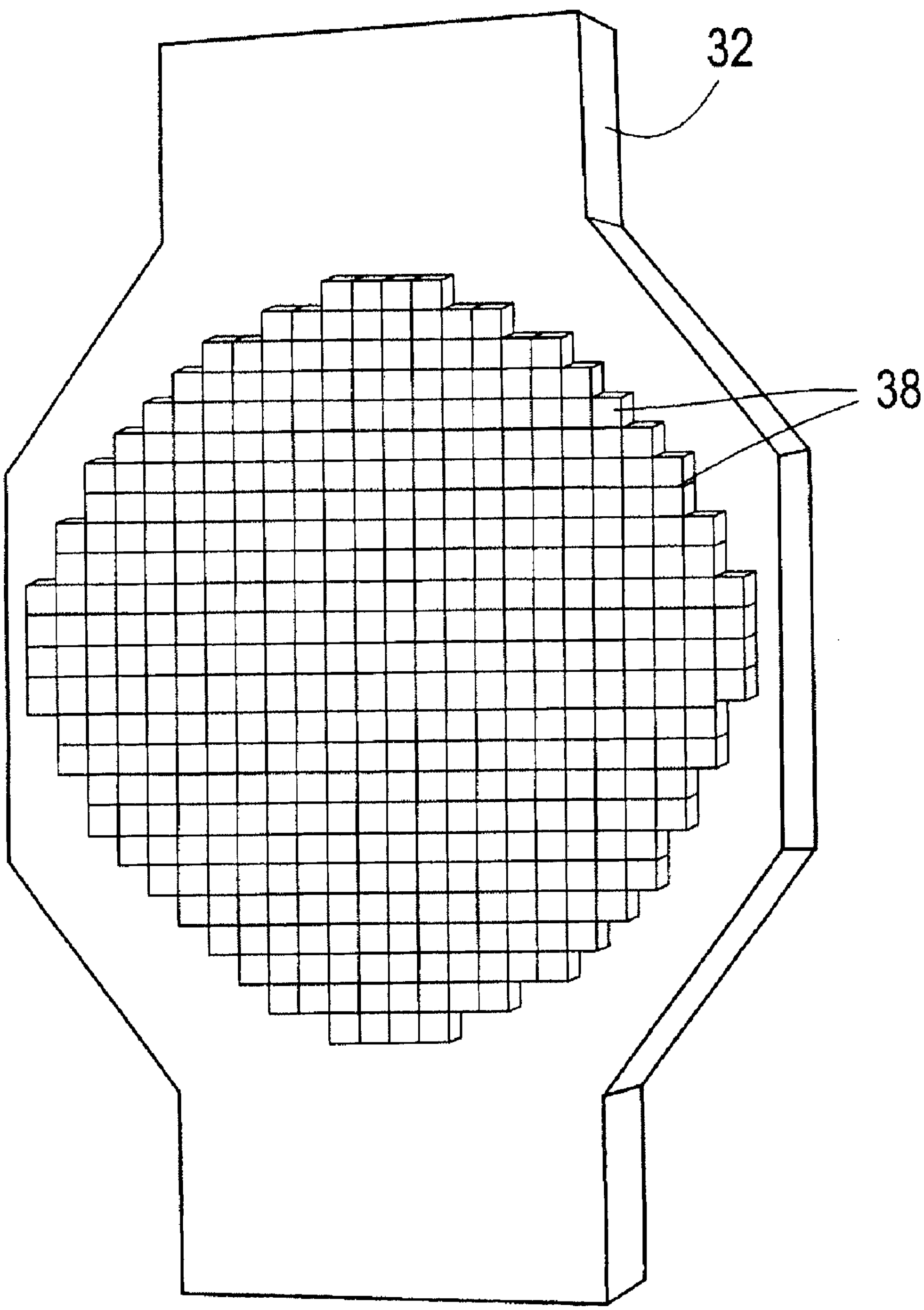
FIG. 4 is a schematic of a yoke plate and blocks utilized in the permanent magnet assembly of FIG. 2.

Referring to FIGS. 2 and 4, the plurality of blocks 38 are disposed on the yoke plate 32 and are constructed of a rare-earth material such as neodymium iron boron (NdFeB). As shown, the blocks 38 are generally cube-shaped and are positioned in rows on the yoke plate 32 to form a substantially circular outer periphery. After being positioned on the yoke plate 32, the blocks 38 are glued to the yoke plate 32. Further, when the blocks 38 are initially positioned on the yoke plate 32, the blocks are non-magnetized. The system and method for magnetizing the blocks 38 will be described below.

The plurality of blocks 39 are disposed on the yoke plate 30 and are constructed of a rare-earth material such as neodymium iron boron (NdFeB). As shown, the blocks 39 are generally cube-shaped and are positioned in rows on the yoke plate 30 to form a substantially circular outer periphery. After being positioned on the yoke plate 30, the blocks 39 are glued to the yoke plate 30. Further, when the blocks 39 are initially positioned on the yoke 30, the blocks are non-magnetized. The system and method for magnetizing the blocks will be described below.

Figure 5:
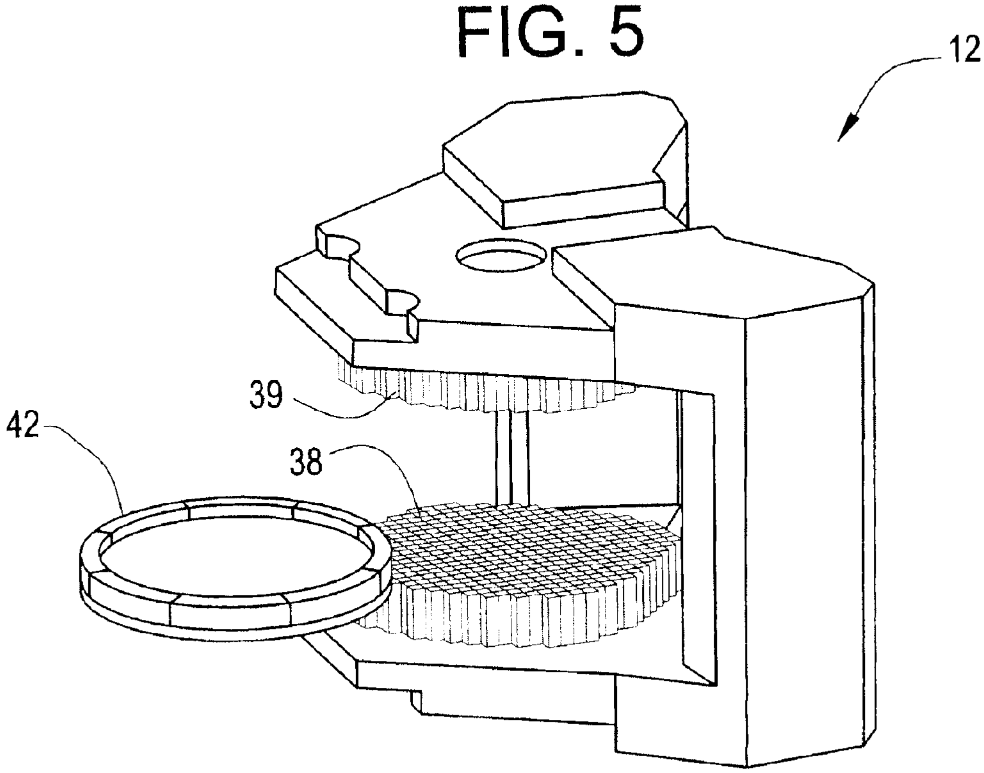
FIG. 5 is a schematic of a permanent magnet assembly of FIG. 2 further including a magnetic pole piece.
Figure 6:
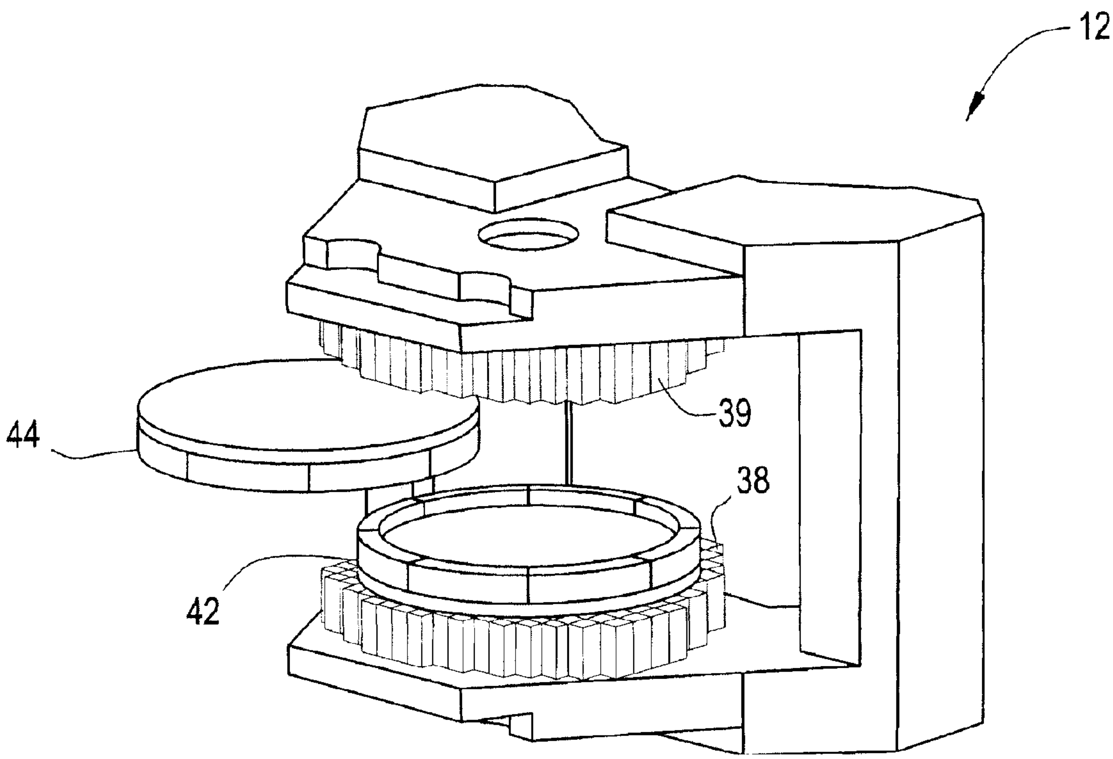
FIG. 6 is a schematic of a permanent magnet assembly of FIG. 2 further including a magnetic pole piece.

Referring to FIGS. 5 and 6, the pole pieces 42 and 44 are optionally coupled to the blocks 38, 39, respectively. The pole piece 42 comprises a substantially ring-shaped ferromagnetic material, such as iron, that is bolted on top of blocks 38 and the yoke plate 32. Similarly, the pole piece 44 comprises a substantially ring-shaped ferromagnetic material that is on top of the blocks 39 and the yoke plate 30.

Figure 3:
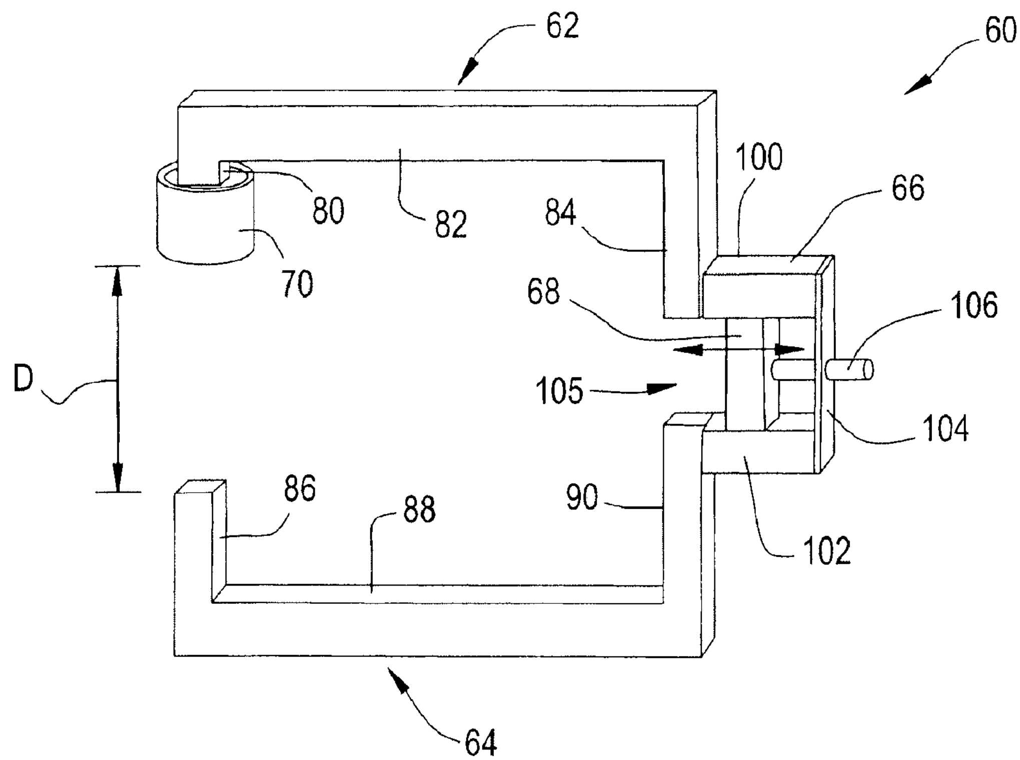
FIG. 3 is a schematic of a magnetizing system in accordance with an exemplary embodiment.
Figure 7:
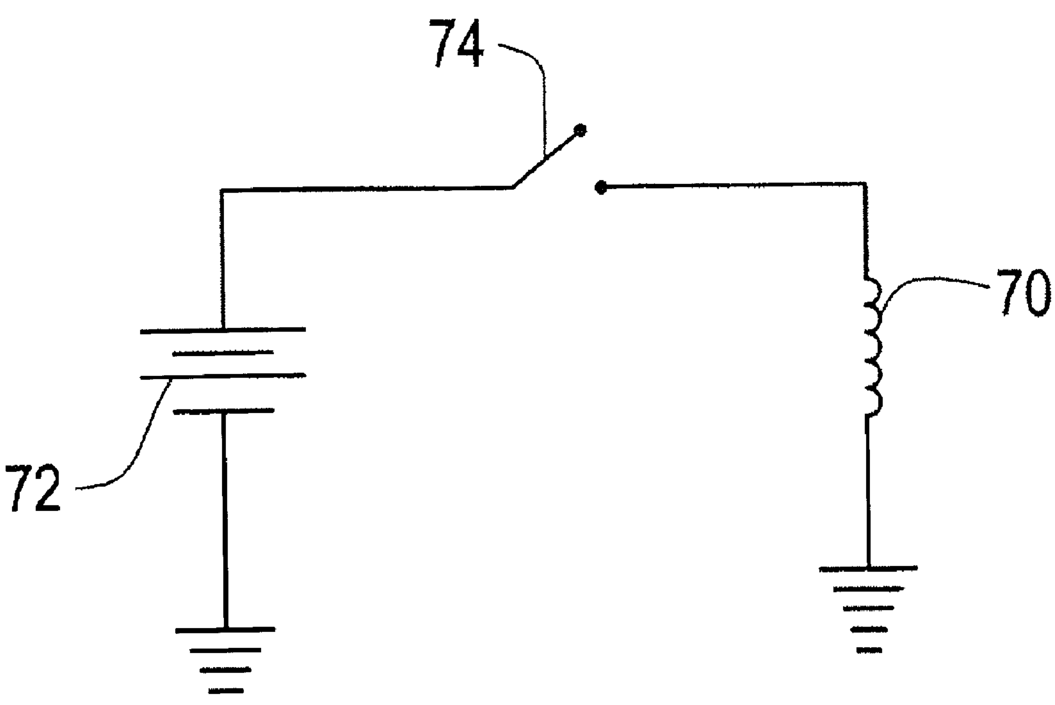
FIG. 7 is an electrical schematic of a circuit for energizing the magnetizing system of FIG. 3.

Referring to FIGS. 3 and 7, a magnetizing system 60 for magnetizing the blocks 38 and the blocks 39 of the magnet assembly 12 in accordance with an exemplary embodiment will now be explained. The magnetizing system 60 includes arm portions 62, 64, a bracket 66, a movable linkage portion 68, an electromagnetic coil 70, a voltage supply 72, and a switch 74.

The arm portions 62, 64 are provided to form a generally C-shaped assembly for fitting over a yoke plate and a plurality of blocks disposed on the yoke plate, for magnetizing the blocks. Each of the arm portions 62, 64 are constructed from a ferrous material such as iron or an iron alloy. In particular the arm portions 62, 64 extend generally parallel to one another. The arm portion 62 includes arm segments 80, 82, 84 operably coupled together utilizing bolts that define a generally U-shaped structure. The arm segment 80 is coupled to a first end of the arm segment 82. Further, the arm segment 84 is coupled at a second end of the arm segment 82. As shown, the electromagnetic coil 70 is coupled to the arm segment 80. The arm portion 64 includes arm segments 86, 88, 90 operably coupled together utilizing bolts to form a generally U-shaped structure. The arm segment 86 is coupled to a first end of the arm segment 88. Further, the arm segment 90 is coupled to a second end of the arm segment 88. The electromagnetic coil 70 and the arm segment 86 are disposed a predetermined distance (D) from one another wherein the distance (D) is substantially equal to the thickness of the yoke plate 32 and the blocks 38. Further, the arm segments 84, 90 extend toward one another and define an air gap 105 there between.

The bracket 66 is provided to operably couple the arm portion 62 to the arm portion 64. The bracket 66 is constructed from a non-magnetic material and includes bracket portions 100, 102 disposed opposite one another and generally parallel to one another. The bracket portions 100, 102 are coupled together via a bracket plate 104 disposed at a first end of each of the portions 100, 102. The bracket portions 100, 102 are further coupled to the arm segments 84, 90, respectively. The bracket 66 further includes a movable member 68 that is movable between the bracket portions 100, 102 using a push rod 106. The moveable member 68 is constructed from iron or an iron alloy. When the movable member 68 is in a first operational position, the member 68 is disposed in the air gap 105 between the arm segments 84, 90 to allow an electromagnetic flux to flow between the arm portions 62 and 64. When the movable member 68 is moved to a second operational position away from the arm segments 84, 90, the air gap 105 is formed to prevent an electromagnetic flux from flowing between the arm portion 62 and 64.

Referring to FIG. 7, a voltage source 72 is provided to energize the electromagnetic coil 70 through a switch 74. When the switch 74 is in a closed operational position, the electromagnetic coil 70 preferably produces an electromagnetic field of about 1–4 Tesla. Of course in alternate embodiments, the electromagnetic field produced by the coil 70 can be greater than 4 Tesla or less than 1 Tesla. Further, when the switch 74 is an open operational position, the electromagnetic coil 70 no longer produces an electromagnetic field.

Figure 8:
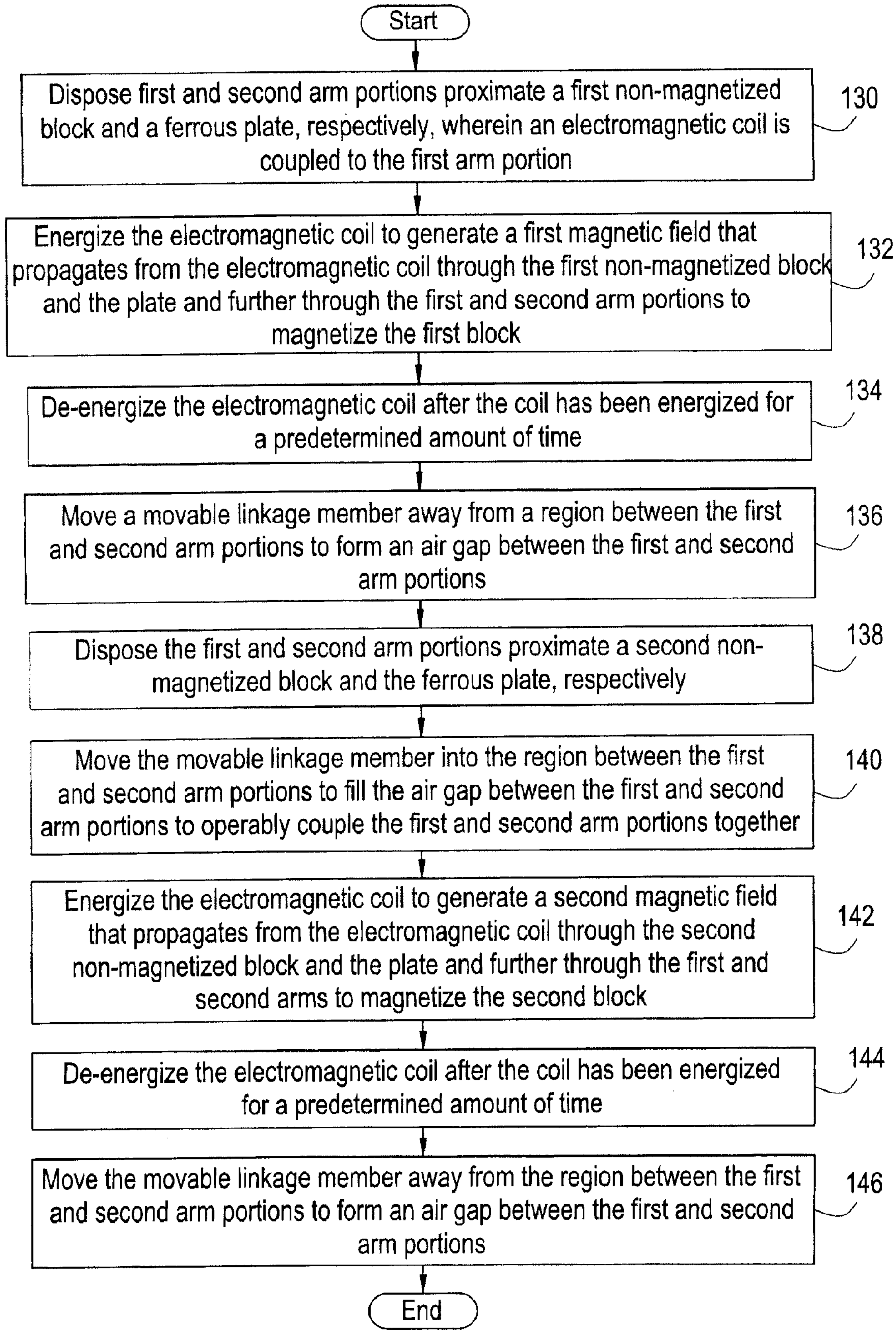
FIG. 8 is a flowchart of a method for energizing non-magnetized blocks of the magnet assembly of FIG. 2 in accordance with another exemplary embodiment.

Referring to FIG. 8, a method for magnetizing blocks in the magnet assembly 12 utilizing the magnetizing system 60 will now be explained. In particular, the method will be directed to illustrating how two blocks of the plurality of blocks 38 are magnetized. It should be noted, however, that all of the plurality of blocks 38 would be magnetized by iteratively repeating the following method. Further, after each of the plurality of blocks 38 are magnetized, the method would be iteratively repeated for each of the plurality of blocks 39.

At step 130, the arm portions 62, 64 are disposed proximate a first non-magnetized block 38 and the ferrous plate 32, respectively, wherein an electromagnetic coil 70 is coupled to the arm portion 62.

At step 132, the electromagnetic coil 70 is energized to generate a first magnetic field that propagates from the electromagnetic coil 70 through the first non-magnetized block 38 and the plate 32 and further through the arm portions 62, 64 to magnetize the first block 74.

At step 134, the electromagnetic coil 70 is de-energized after the coil 70 has been energized for a predetermined amount of time.

At step 136, the movable linkage member 68 is moved away from a region between the arm portions 62, 64 to form an air gap between the arm portions 62, 64.

At step 138, the arm portion 62, 64 are disposed proximate a second non-magnetized block 38 and the ferrous plate 32, respectively.

At step 140, the movable linkage member 68 is moved into the region between the arm portions 62, 64 to fill the air gap between the arm portions 62, 64 to operably couple the arm portions 62, 64 together.

At step 142, the electromagnetic coil 70 is energized to generate a second magnetic field that propagates from the electromagnetic coil 70 through the second non-magnetized block 38 and the plate 32 and further through the arm portions 62, 64 to magnetize the second block 38.

At step 144, the electromagnetic coil 70 is de-energized after the coil 70 has been energized for a predetermined amount of time.

Finally, at step 146, the movable linkage member 68 is moved away from the region between the arm portions 62, 64 to form an air gap between the arm portions 62, 64.

Figure 9:
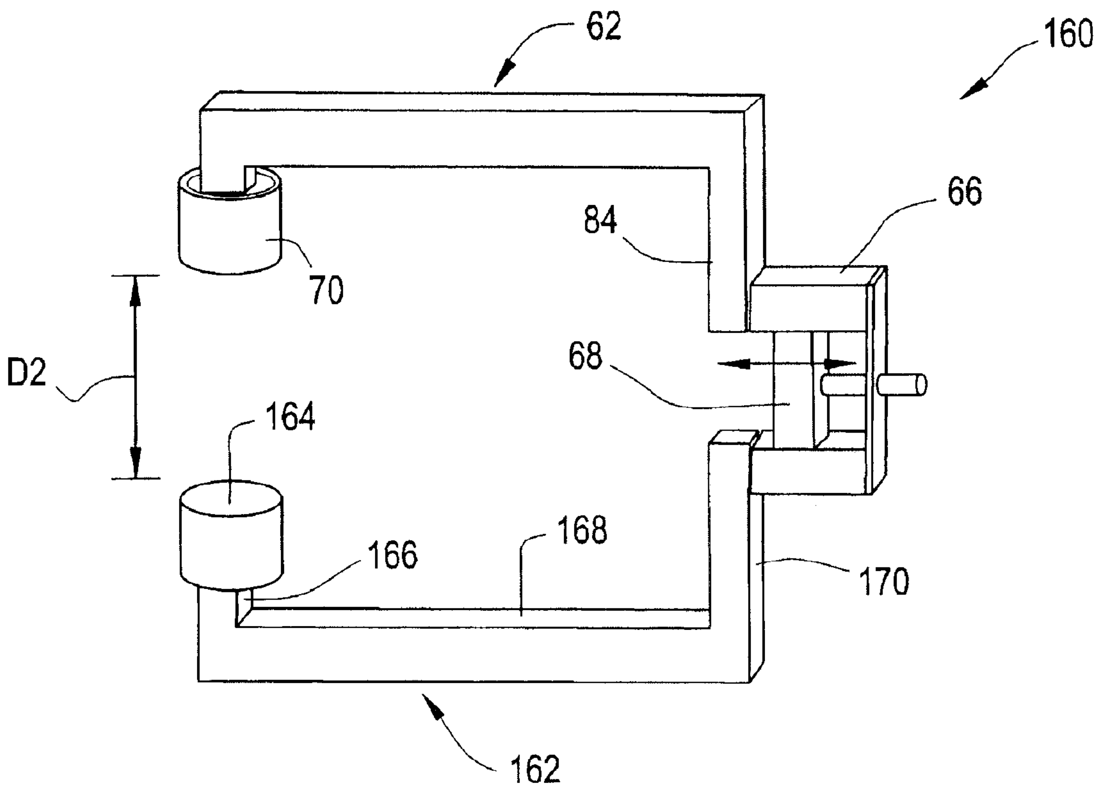
FIG. 9 is a schematic of a magnetizing system in accordance with another exemplary embodiment.
Figure 10:
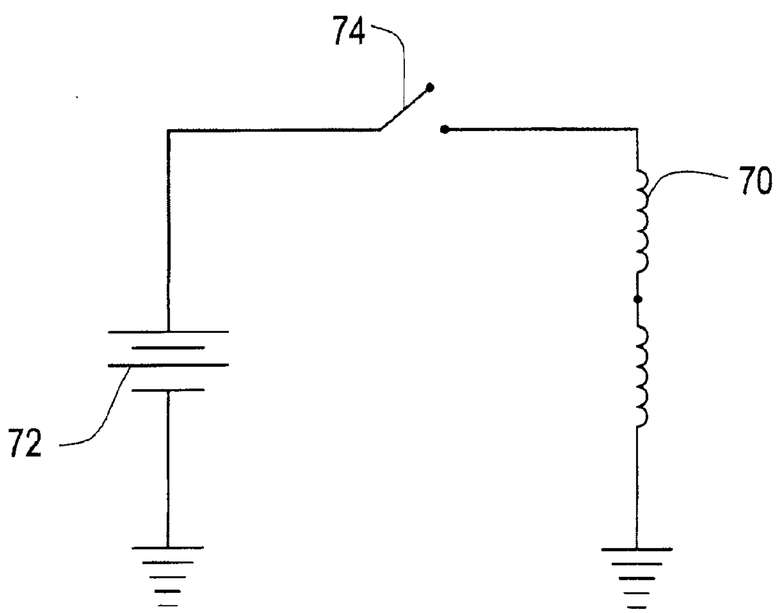
FIG. 10 is an electrical schematic of a circuit for energizing the magnetizing system of FIG. 9.

Referring to FIGS. 9 and 10, a magnetizing system 160 for magnetizing the blocks 38 and the blocks 39 of the magnet assembly 12 in accordance with another exemplary embodiment will now be explained. The magnetizing system 160 includes arm portions 62, 162, the bracket 66, the movable linkage portion 68, the electromagnetic coil 70, the voltage supply 72, the switch 74, and the electromagnetic coil 164.

The primary difference between the magnet assembly 160 and the magnet assembly 12 is that the magnet assembly 160 includes a second electromagnetic coil (i.e., electromagnetic coil 164). Further, the magnet assembly 160 includes an arm portion 162 instead of the arm portion 64. The arm portion 162 includes arm segments 166, 168, and 170. The arm segment 166 is operably coupled to the arm segment 168 at a first end of the arm segment 168. Further, the arm segment 170 is operably coupled to a second end of the arm segment 168. The segment 170 extends towards the arm segment 84 and defines an air gap there between. Further, the electromagnetic coil 164 is operably coupled to the arm segment 166. The distance (D2) between the electromagnetic coils 70, 164 is substantially equal to the thickness of the yoke plate 32 and the blocks 38.

Figure 11:
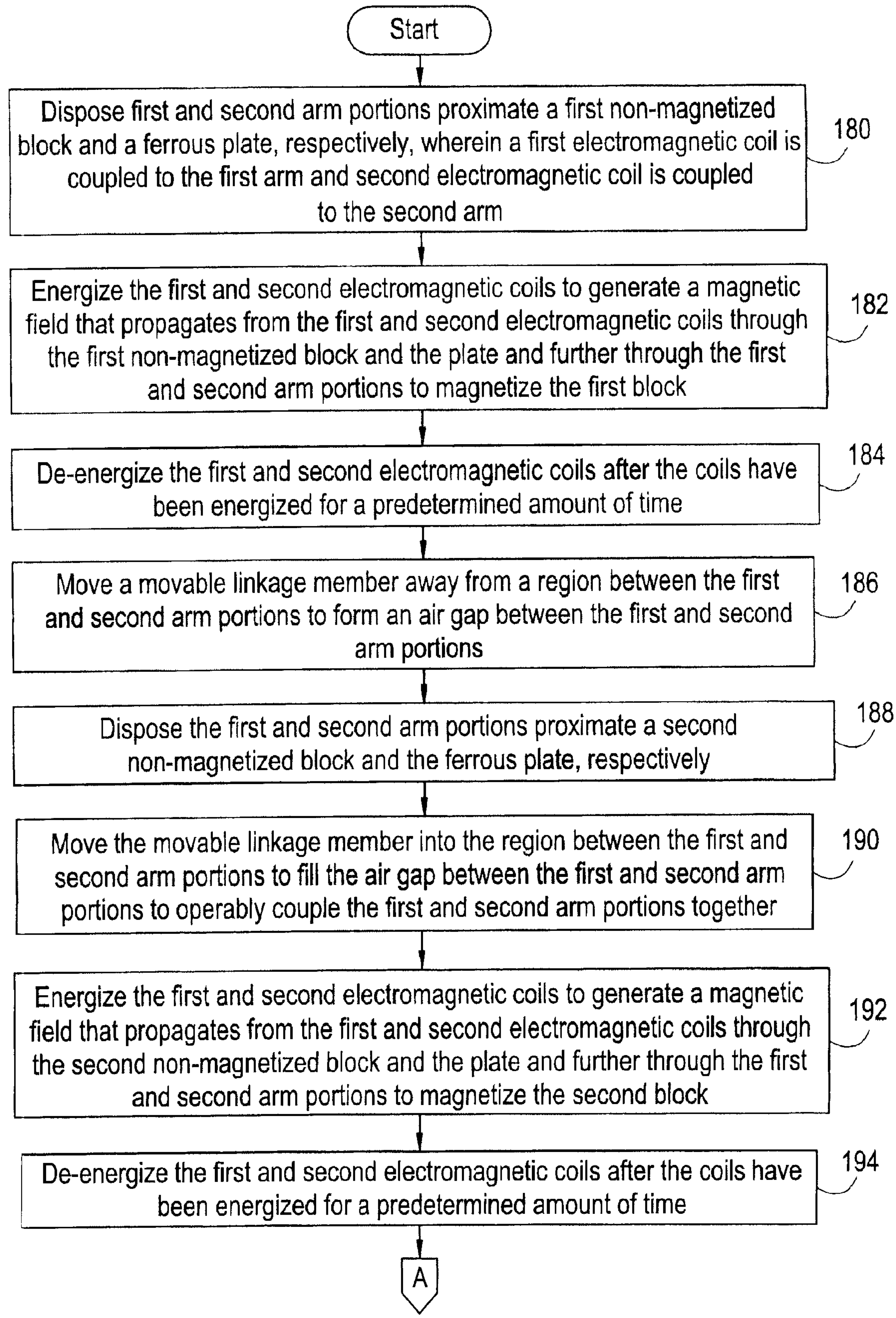
FIGS. 11 and 12 are flowcharts of a method for energizing non-magnetized blocks of the magnet assembly of FIG. 2 in accordance with another exemplary embodiment.
Figure 12:
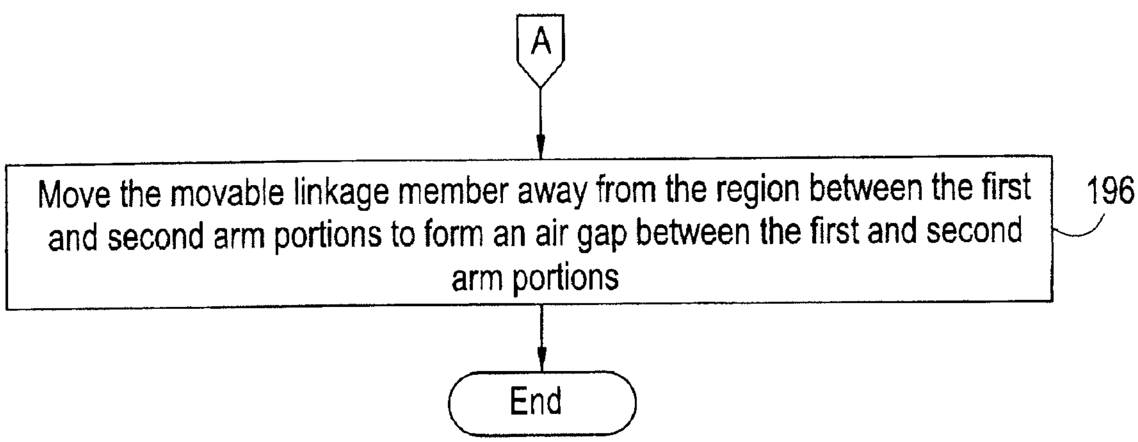

Referring to FIGS. 11 and 12, a method for magnetizing blocks in the magnet assembly 12 utilizing the magnetizing system 160 will now be explained. In particular, the method will be directed to illustrating how two blocks of the plurality of blocks 38 are magnetized. It should be noted, however, that all of the blocks 38 would be magnetized by iteratively repeating the following method. Further, after all of the blocks 38 are magnetized, the method would be iteratively repeated for each of the plurality of blocks 39.

At step 180, the arm portion 62, 162 are disposed proximate a first non-magnetized block 38 and the ferrous plate 32, respectively, wherein the electromagnetic coil 70 is coupled to the arm portion 62 and the electromagnetic coil 164 is coupled to the arm portion 162.

At step 182, the electromagnetic coils 70, 164 are energized to generate a magnetic field that propagates from the coils 70, 164 through the first non-magnetized block 38 and the plate 32 and further through arm portions 62, 162 to magnetize the first block 38.

At step 184, the electromagnetic coils 70, 164 are de-energized after the coils 70, 164 have been energized for a predetermined amount of time.

At step 186, the movable linkage member 68 is moved away from a region between the arm portions 62, 162 to form an air gap between the arm portions 62, 162.

At step 188, the arm portions 62, 162 are disposed proximate a second non-magnetized block 38 and the ferrous plate 32, respectively.

At step 190, the movable linkage member 68 is moved into the region between the arm portions 62, 162 to fill the air gap between the arm portions 62, 162 to operably couple the arm portions 62, 162 together.

At step 192, the electromagnetic coils 70, 164 are energized to generate a magnetic field that propagates from the electromagnetic coils 70, 164 through the second non-magnetized block 38 and the plate 32 and further through the arm portions 62, 162 to magnetize the second block 38.

At step 194, the electromagnetic coils 70, 164 are de-energized after the coils 70, 164 have been energized for a predetermined time.

Finally, at step 196, the movable linkage member 68 is moved away from the region between the arm portions 62, 162 to form an air gap between the arm portions 62, 162.

The system and method for magnetizing a plurality of substantially non-magnetized blocks of a magnetic assembly used in an MRI device provides a substantial advantage over other systems and methods. In particular, the system and method provides a technical effect of allowing the magnetization of individual blocks of a magnetic assembly utilizing a relatively simple magnetizing device. As a result, large fixtures and current drivers for simultaneously magnetizing a plurality of blocks are no longer needed.

While embodiments of the invention are described with reference to the exemplary embodiments, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling with the scope of the intended claims. Moreover, the use of the term's first, second, etc. does not denote any order of importance, but rather the term's first, second, etc. are used to distinguish one element from another. Furthermore, the use of the terms a, an, etc. do not denote a limitation of quantity, but rather denote the presence of at least one of the referenced items.

What is claimed is:

1. A system for magnetizing one of a plurality of substantially non-magnetized blocks disposed on a plate of a magnet assembly used in an MRI device, comprising:

first and second arm portions operably coupled together;

a first electromagnetic coil disposed on a first end of the first arm portion, wherein the first electromagnetic coil is configured to generate a magnetic field that propagates from the first electromagnetic coil through at least one non-magnetized block and the plate and further through the first and second arm portions to magnetize the block; and a bracket coupled between the first and second arms portions and a movable portion operably coupled to the bracket, wherein an air gap is defined between the first and second arm portions, the moveable portion being configured to be positioned within the air gap to form a magnetic field path between the first and second arm portions.

2. The system of claim 1, wherein the bracket is constructed from a non-magnetic material.

3. The system of claim 1, wherein the moveable portion is constructed from iron or an alloy containing iron.

4. The system of claim 1, wherein the first electromagnetic coil generates a magnetic field having magnitude of 3–4 Tesla.

5. The system of claim 1, wherein the first and second arm portions are constructed from iron or an alloy containing iron.

6. The system of claim 1, further comprising a voltage source operably coupled to the first electromagnetic coil, the voltage source inducing the first electromagnetic coil to generate a magnetic field.

7. The system of claim 1, further comprising:

a second electromagnetic coil disposed on a first end of the second arm portion, wherein the second electromagnetic coil is configured to generate a magnetic field that propagates from the second electromagnetic coil through the first and second arm portions and at least one non-magnetized block and the plate to magnetize the block.

8. A method for magnetizing at least one of a plurality of substantially non-magnetized blocks disposed on a plate of a magnet assembly used in an MRI device, comprising:

disposing first and second arm portions proximate a first non-magnetized block and the plate, respectively, wherein a first electromagnetic coil is coupled to the first arm portion; and energizing the first electromagnetic coil to generate a first magnetic field that propagates from the first electromagnetic coil through the first non-magnetized block and the plate and further through the first and second arm portions to magnetize the first block.

9. The method of claim 8, further comprising:

disposing first and second arm portions proximate a second non-magnetized block and the plate, respectively, wherein a first electromagnetic coil is coupled to the first arm and the first electromagnetic coil is disposed adjacent the second non-magnetized block; and energizing the first electromagnetic coil to generate a second magnetic field that propagates from the electromagnetic coil through the second non-magnetized block and the plate and further through the first and second arm portions to magnetize the second block.

10. The method of claim 8, wherein the first electromagnetic coil generates the first magnetic field having magnitude of 3–4 Tesla.

11. The method of claim 8, further comprising de-energizing the first electromagnetic coil after the first electromagnetic coil has been energized for a predetermined amount of time.

12. The method of claim 11, wherein the predetermined amount of time is at least 1 second.

13. The method of claim 11, further comprising forming an air gap between the first and second arm portions to stop propagation of the first magnetic field through the first and second arm portions.

14. The method of claim 8, wherein the first block is disposed substantially in a central region of the plurality of substantially non-magnetized blocks disposed on the plate.

15. The method of claim 8, wherein the second arm portion operably contacts the plate.

16. The method of claim 8, wherein a second electromagnetic coil is coupled to the second arm, the method further comprising energizing the second electromagnetic coil to generate a second magnetic field that propagates from the second electromagnetic coil through the first and second arm portions and the first non-magnetized block and the plate to magnetize the first block.

* * * * *

UNITED STATES PATENT AND TRADEMARK OFFICE

CERTIFICATE OF CORRECTION

PATENT NO. : 6,958,672 B1
DATED : October 25, 2005
INVENTOR(S) : Weijun Shen

It is certified that error appears in the above-identified patent and that said Letters Patent is hereby corrected as shown below:

Column 1,
Line 9, after "resonance" delete "imagining" and insert -- imaging --.

Column 3,
Line 23, after "ring-shaped" delete "ferromagnetic" and insert -- ferro-magnetic --.

Column 6,
Line 10, after "made and" delete "equivalence" and insert -- equivalents --.
Line 17, after "falling" delete "with" and insert -- within --.
Line 18, after "of the" delete "term's" and insert -- terms --.
Line 20, after "the" delete "term's" and insert -- terms --.

Signed and Sealed this

Fourteenth Day of February, 2006

JON W. DUDAS
*Director of the United States Patent and Trademark Office*